(12) United States Patent
Chien

(10) Patent No.: US 6,310,771 B1
(45) Date of Patent: Oct. 30, 2001

(54) CPU HEAT SINK

(76) Inventor: Chuan-Fu Chien, 15/F-4., No. 3, Liyuan 1st St., Linkou Hsaing, Taipei County (TW)

( * ) Notice: Subject to any disclaimer, the term of this patent is extended or adjusted under 35 U.S.C. 154(b) by 0 days.

(21) Appl. No.: 09/710,860

(22) Filed: Nov. 14, 2000

(51) Int. Cl.$^7$ ...................................................... H05K 7/20
(52) U.S. Cl. .......................... 361/697; 361/695; 361/690; 361/694; 361/704; 361/709; 361/710; 257/718; 257/719; 257/722; 174/16.1; 174/16.3; 165/80.3; 165/185
(58) Field of Search .................................... 361/688–690, 361/694, 695, 704, 707, 709, 710; 165/80.3, 185; 174/16.3; 257/706, 707, 712, 713, 717, 718, 719, 721, 722

(56) References Cited

U.S. PATENT DOCUMENTS

| | | | |
|---|---|---|---|
| 5,558,155 | * | 9/1996 | Ito ........................................ 165/80.3 |
| 5,864,464 | * | 1/1999 | Lin ........................................ 361/697 |
| 6,017,185 | * | 1/2000 | Kuo ....................................... 415/177 |
| 6,062,301 | * | 5/2000 | Lu ......................................... 165/80.3 |
| 6,104,609 | * | 8/2000 | Chen ..................................... 361/695 |

* cited by examiner

Primary Examiner—Gerald Tolin
Assistant Examiner—Boris L. Chervinsky
(74) Attorney, Agent, or Firm—Rosenberg, Klein & Lee

(57) ABSTRACT

A CPU heat sink includes a copper bottom panel, a plurality of copper radiating fins arranged in parallel on the bottom panel, the radiating fins each having a transverse foot bar, a plurality of strips respectively upwardly extended from the transverse foot bar and arranged in parallel, and a plurality of horizontal locating flanges respectively extended from the transverse foot bar at right angles, and an aluminum base molded on the bottom panel and the transverse foot bar and locating flanges of each radiating fin by die casting, the aluminum base having four upright posts disposed in four corners, the upright posts each having a square top and a screw hole on the square top, and four bearing blocks respectively fastened to the upright posts of the aluminum base and adapted to support a fan above the radiating fins, the bearing blocks each having a countersunk hole fastened to the screw hole of one upright post of the aluminum base by a screw, and at least one screw hole for the mounting of a fan.

8 Claims, 7 Drawing Sheets

CPU HEAT SINK

BACKGROUND OF THE INVENTION

The present invention to apparatus adapted to dissipate heat from a CPU and, more particularly, to a high performance CPU heat sink for quick dissipation of heat from a CPU.

Following fast development of high-tech, the operation speed of the CPU (central processing unit)—the heart of a computer—is made faster than ever. However, a high performance CPU produces much heat during its operation, and heat must be quickly carried away so as not to affect the function of the CPU. Various cooling devices and structures have been disclosed for this purpose. FIG. 9 shows a CPU cooling structure according to the prior art. This CPU cooling structure comprises a heat sink 5 having upright radiating fins 51, a clamp 6 adapted to secure the heat sink 5 to a CPU. and a fan 7 adapted to blow air through the heat sink 51 for quick dissipation of heat. This CPU cooling structure is still not satisfactory in function, and has numerous drawbacks as outlined hereinafter.

1. Because the heat sink 5 is made of aluminum by die cast, the thickness of the radiating fins 51 of the heat sink 5 cannot be reduced to the satisfactory status (thinner than 1 mm). The heat dissipation efficiency of thick radiating fins is low.
2. Because the heat sink 5 is made subject to a particular model of fan, a different size of heat sink should be used to match with a different size of fan.
3. Because the base of the heat sink is a flat surface, the downwardly protruded middle pressure portion 61 of the clamp 6 may slip on the base of the heat sink after installation of the clamp 6.

SUMMARY OF THE INVENTION

The present invention has been accomplished under the circumstances in view. According to one aspect of the present invention, the CPU heat sink comprises a copper bottom panel, a plurality of copper radiating fins arranged in parallel on the bottom panel, the radiating fins each having a transverse foot bar, a plurality of strips respectively upwardly extended from the transverse foot bar and arranged in parallel, and a plurality of horizontal locating flanges respectively extended from the transverse foot bar at right angles, and an aluminum base molded on the bottom panel and the transverse foot bar and locating flanges of each radiating fin by die casting, the aluminum base having four upright posts disposed in four corners, the upright posts each having a square top and a screw hole on the square top, and four bearing blocks respectively fastened to the upright posts of the aluminum base and adapted to support a fan above the radiating fins, the bearing blocks each having a countersunk hole fastened to the screw hole of one upright post of the aluminum base by a screw, and at least one screw hole for the mounting of a fan. According to another aspect of the present invention, the strips of the radiating fins are stepped strips, each having a width made gradually reduced from the transverse foot bar toward the distal end for quick dissipation of heat. According to another aspect of the present invention, different sizes of bearing blocks can be selectively fastened to the upright posts of the aluminum base of the heat sink to support any of a variety of fans. According to still another aspect of the present invention, the aluminum base of the heat sink has a top center recess for positive positioning of the downwardly protruded middle pressure portion of a clamp being used to secure the heat sink to a CPU.

DETAILED DESCRIPTION OF THE PREFERRED EMBODIMENT

Figure 1:
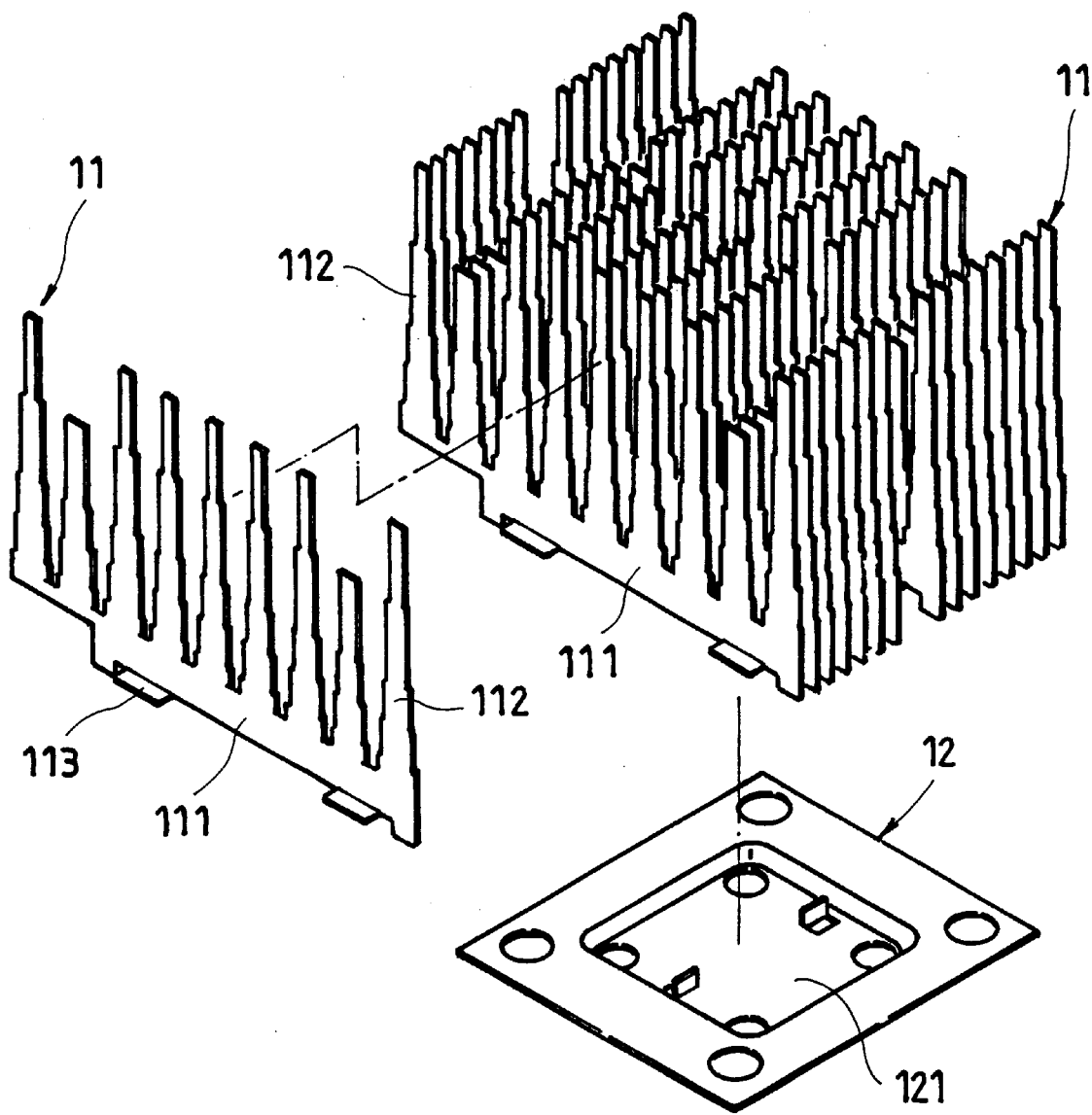
FIG. 1 is an exploded view of a bottom panel and radiating fins for a heat sink constructed according to the present invention.
Figure 2:
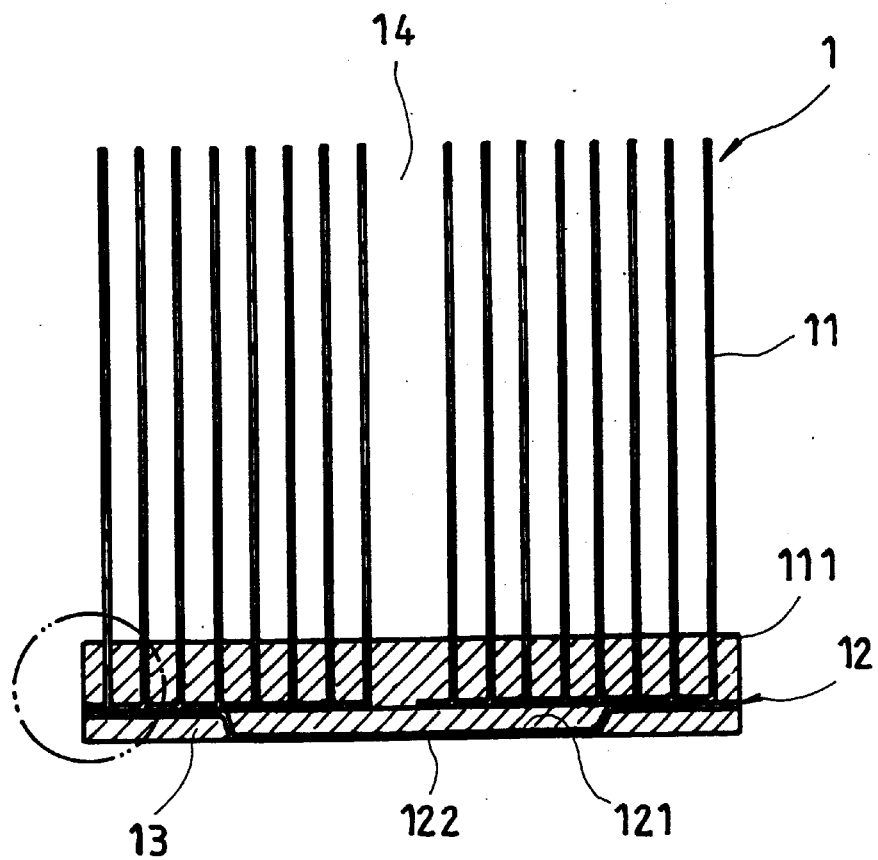
FIG. 2 is a sectional view showing an aluminum base molded on the bottom panel and the radiating fins according to the present invention.
Figure 3:
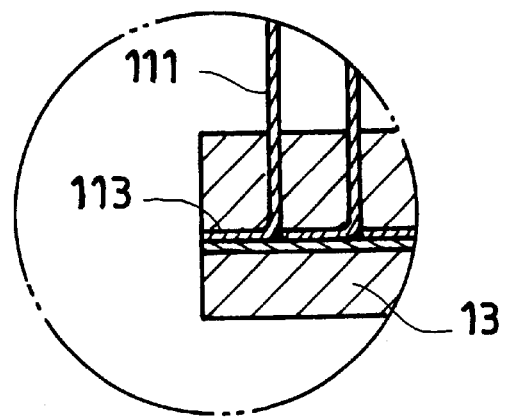
FIG. 3 is an enlarged view of a part of FIG. 2.
Figure 4:
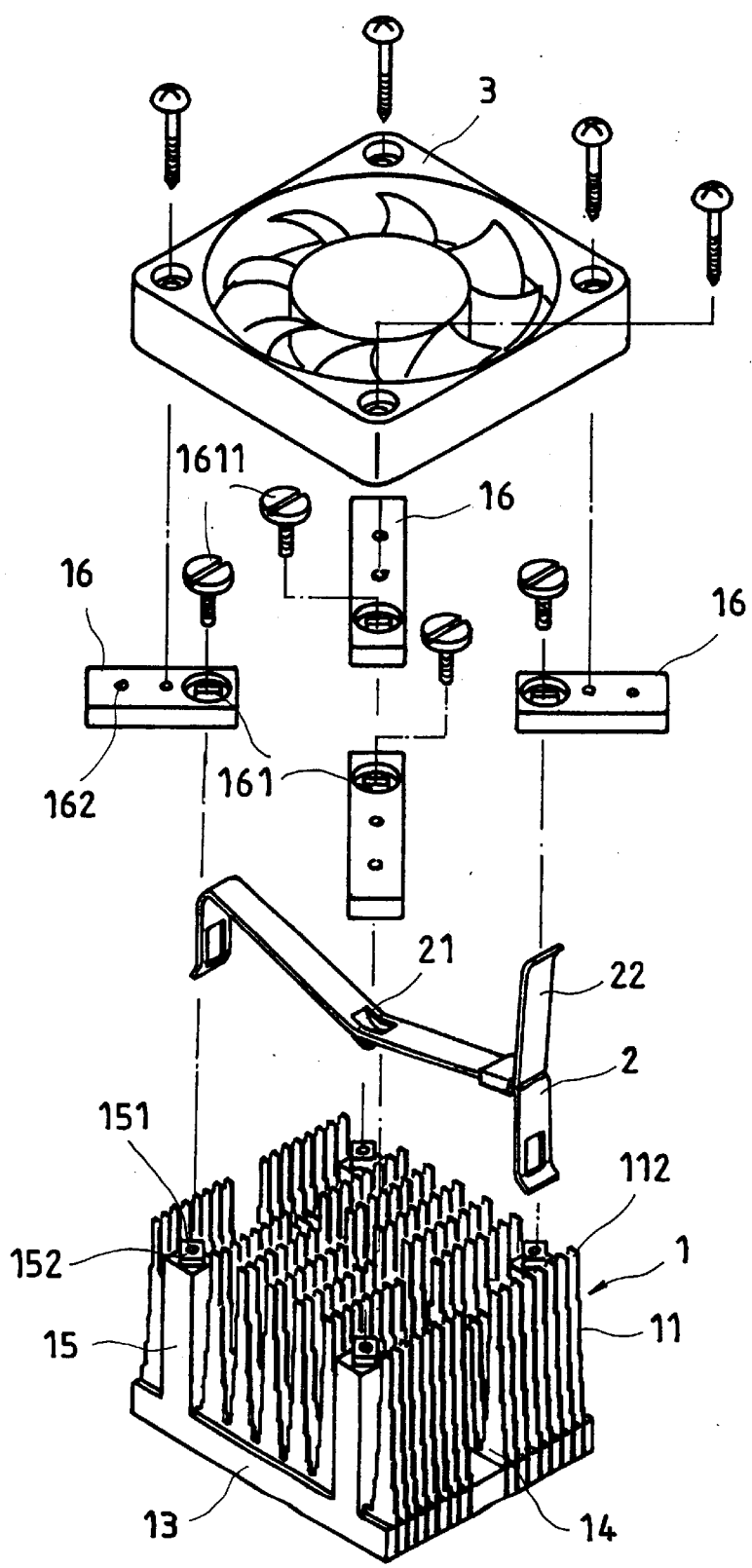
FIG. 4 is an exploded view of a CPU cooling arrangement according to the present invention.
Figure 5:
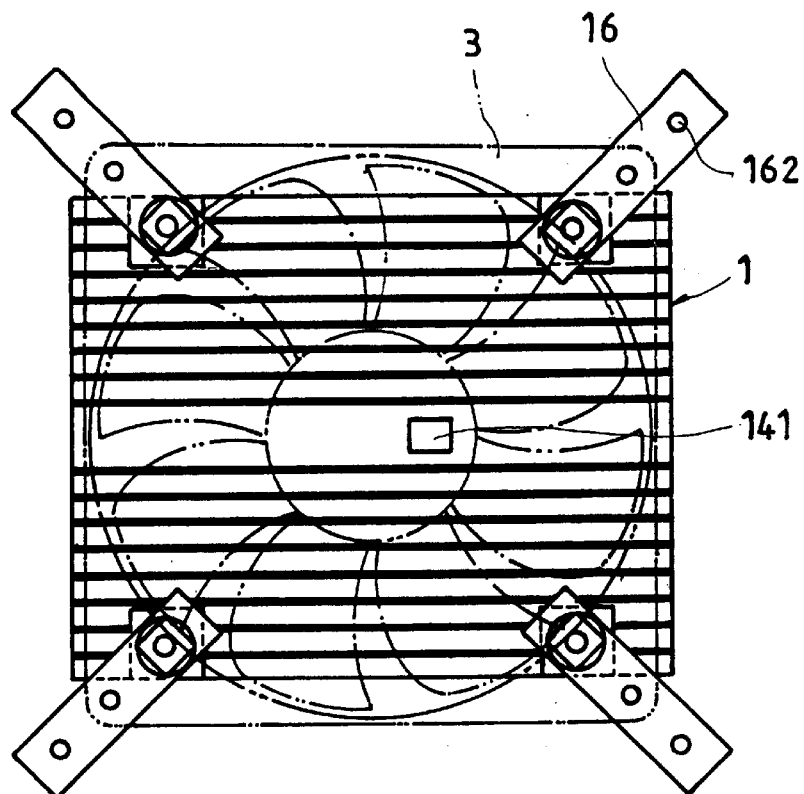
FIG. 5 is a top view of the assembly of the CPU cooling arrangement shown in FIG. 4.
Figure 6:
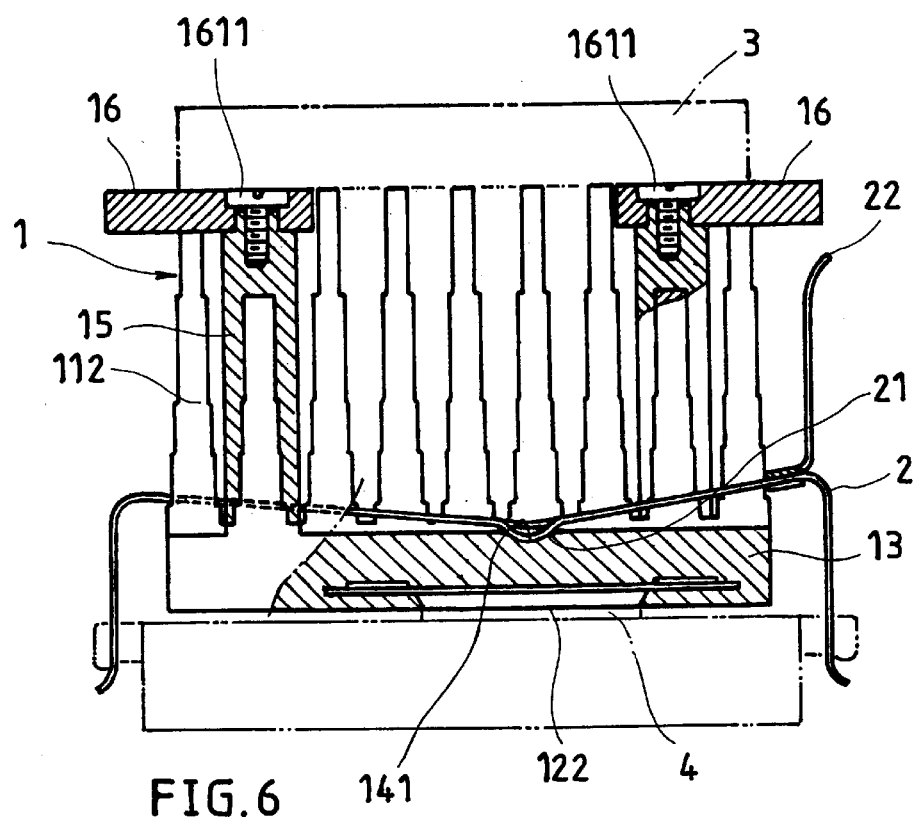
FIG. 6 is a side view in section of FIG. 5.

Referring to FIGS. from 1 through 6, a CPU cooling arrangement is shown a heat sink 1, a clamp 2, which secures the heat sink 1 to a CPU 4, and a fan 3 fixedly fastened to the heat sink 1 at the top and controlled to blow air through the heat sink 1.

The heat sink 1 comprises a bottom panel 12 made of a copper sheet by stamping, a plurality of radiating fins 11 arranged in parallel in vertical position on the bottom panel 12, an aluminum base 13 directly molded on the bottom panel 12 and the radiating fins 11 by die casting to secure the bottom panel 12 and the radiating fins 11 together, and four bearing blocks 16 adapted to support the fan 3 on the radiating fins 11. The radiating fins 11 are respectively made of a copper sheet by stamping, each comprising a transverse foot bar 111 embedded in the aluminum base 13, a plurality of stepped strips 112 respectively upwardly extended from the transverse foot bar 111 and arranged in parallel outside the aluminum base 13, and a plurality of horizontal locating flanges 113 respectively extended from the transverse foot bar 111 at right angles and embedded in the aluminum base 13. The stepped strips 112 each have a width made gradually reduced from the foot bar 111 toward the distal (top) end. The bottom panel 12 has a top recess 121, and a downwardly protruded flat bottom contact face 122 disposed in contact with the top surface of the CPU 4. The aluminum base 13 filled up the top recess 121 and covers over the topside of the bottom panel 12 and the foot bar 111 and locating flanges 113 of each radiating fin 11 and the bottom side of the bottom panel 12 around the downwardly protruded flat bottom contact face 122. The bottom side of the aluminum base 13 is disposed in flush with the downwardly protruded flat bottom contact face 122. The radiating fins 11 are arranged in two parallel sets that are spaced by a narrow, elongated space 14. Because the stepped strips 112 each have a width made gradually reduced from the foot bar 111 toward the distal (top) end, heat can be quickly transmitted from the bottom side of the heat sink 1 toward the topside thereof. Because the radiating fins 11 are made of copper, he stepped strips 112 can be made as thinner as possible. The aluminum base 13 comprises four upright posts 15 in four corners, and a top center recess 141 on the middle of the space 14 corresponding to the center of the CPU 4. The upright posts 15 each have a square top 152 and a screw hole 151 on the flat top surface of the square top 152. The bearing blocks 16 each comprise a countersunk hole 161 fastened to the screw hole 151 of one upright post 15 by a respective screw 1611, and at least one screw hole 162 for the mounting of the fan 3. The clamp 2 comprises a downwardly protruded middle positioning portion 21 engaged into the top center recess 141 of the aluminum base 13, and a locking lever 22 at one end for locking control.

Referring to FIGS. from 4 through 6 again, after the bearing blocks 16 have been respectively fastened to the upright posts 15, the heat sink 1 is attached to the CPU 4, and then the clamp 2 is mounted in the space 14 and fastened to the CPU 4 to secure the heat sink 1 and the CPU 4 together, and then the fan 3 is fastened to the bearing blocks 16 by screws. During the operation of the CPU 4, the fan 3 is operated to blow air through the radiating fins 11 of the heat sink 1, and therefore heat is quickly carried away from the CPU 4 into the air.

Figure 7:
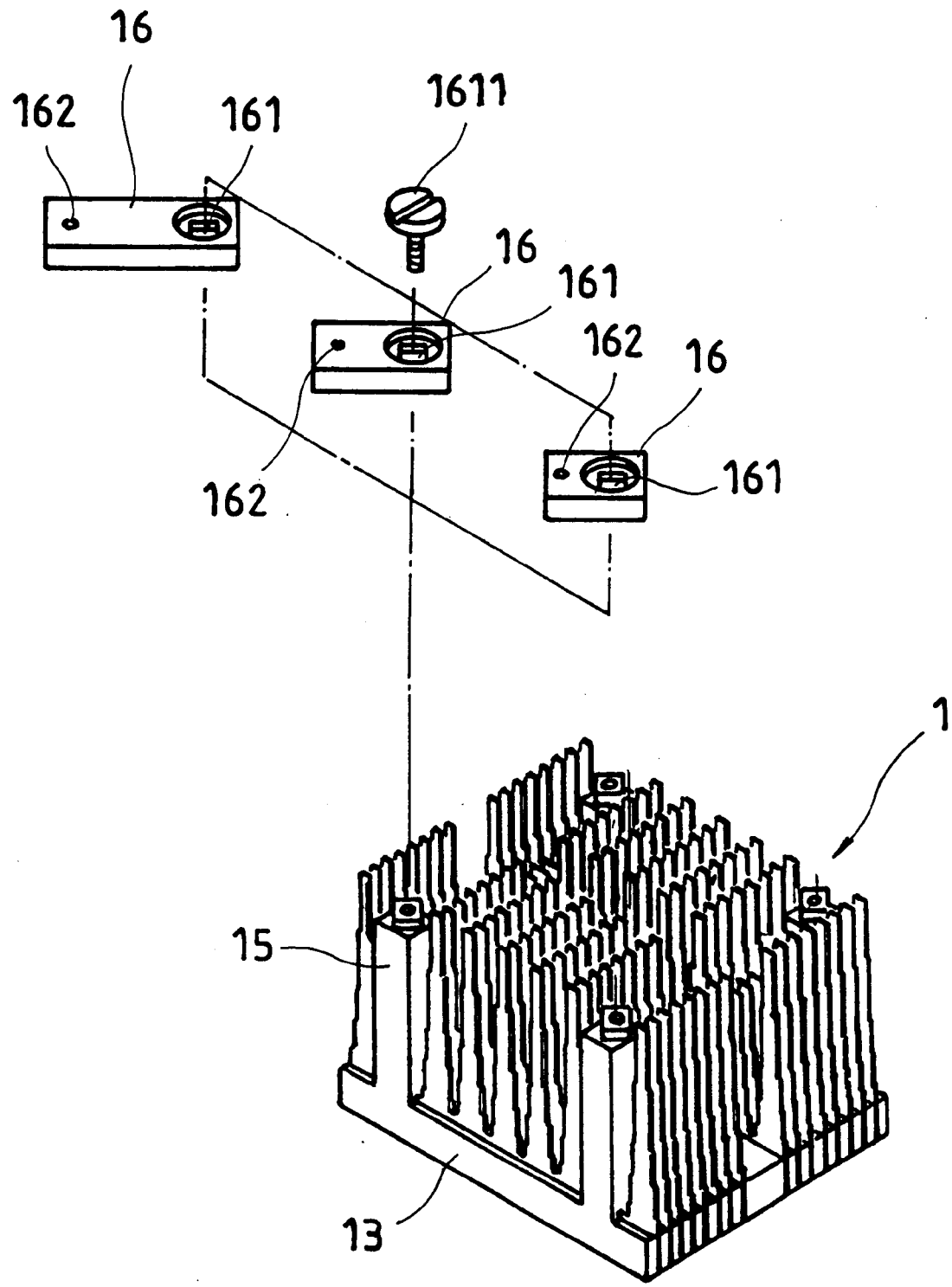
FIG. 7 illustrates different sizes of bearing blocks selectively used with the heat sink according to the present invention.

Referring to FIG. 7, the bearing blocks 16 can have different sizes adapted to fit fans of different sizes.

Figure 8:
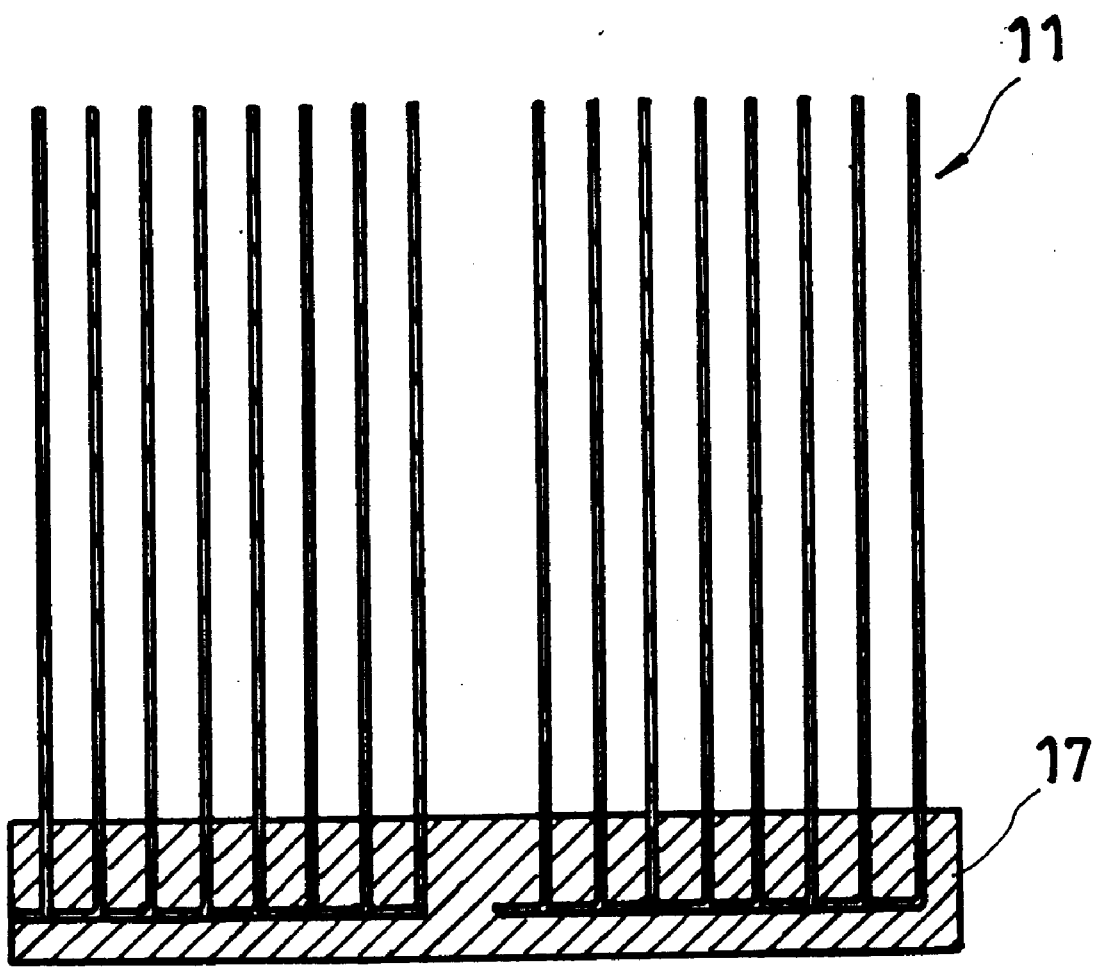
FIG. 8 is a sectional view showing an alternate form of the heat sink according to the present invention.
Figure 9:
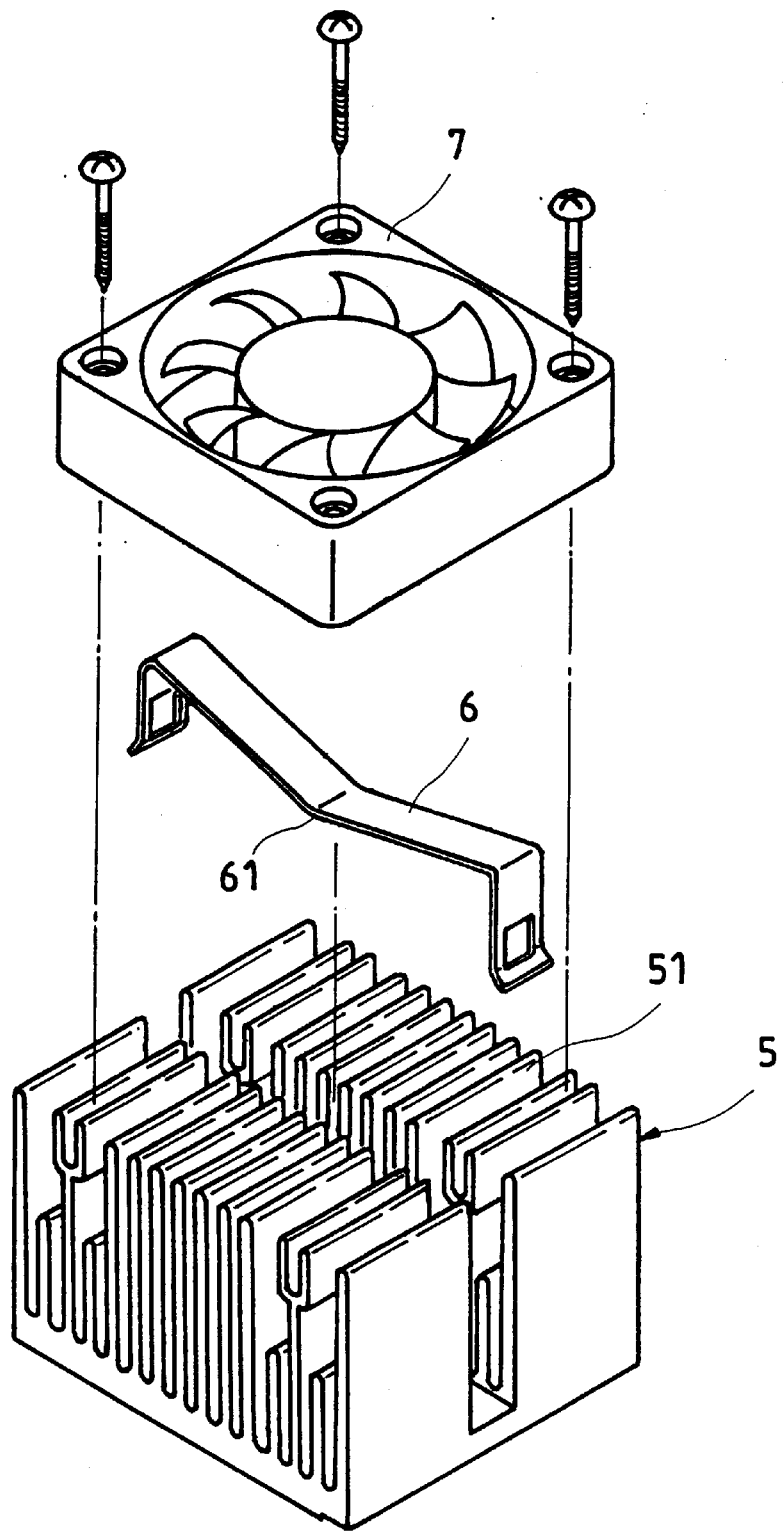
FIG. 9 is an exploded view of a CPU cooling structure according to the prior art.

FIG. 8 shows an alternate form of the heat sink. According to this alternate form, the heat sink comprises two sets of parallel radiating fins 11, and a metal base 17 molded on the radiating fins 11 at the bottom side. The metal base 17 has a flat bottom surface for direct contact with the CPU.

It is to be understood that the drawings are designed for purposes of illustration only, and are not intended for use as a definition of the limits and scope of the invention disclosed.

What the invention claimed is:

1. A CPU heat sink adapted for mounting on a CPU to support a fan for dissipation of heat from the CPU, comprising:
   a bottom panel made of a copper sheet by stamping, said bottom panel having a top recess and a flat bottom contact face for contact with the CPU;
   a plurality of metal radiating fins arranged in parallel on said bottom panel, said radiating fins each comprising a transverse foot bar, a plurality of stepped strips respectively upwardly extended from said transverse foot bar and arranged in parallel, and a plurality of horizontal locating flanges respectively extended from said transverse foot bar at right angles;
   a metal base molded on said bottom panel and the transverse foot bar and locating flanges of each of said radiating fins by die casting and filled up said top recess of said bottom panel, said metal base comprising four upright posts disposed in four corners, said upright posts each comprising a square top and a screw hole on said square top; and
   four bearing blocks respectively fastened to said upright posts of said metal base and adapted to support a fan above said radiating fins, said bearing blocks each comprising a countersunk hole fastened to the screw hole of one upright post of said metal base by a screw, and at least one screw hole for the mounting of a fan.

2. The CPU heat sink of claim 1, wherein the stepped strips of said radiating fins each have a width made gradually reduced from the respective foot bar toward the distal end.

3. The CPU heat sink of claim 1, wherein said radiating fins are arranged in two symmetrical sets spaced by a space, and said metal base has a top center recess disposed in the middle of the space between the two symmetrical sets of radiating fins corresponding to the center of the CPU to which said heat sink is attached for the positioning of a downwardly protruded middle portion of a clamp being used to secure said heat sink to the CPU.

4. The CPU heat sink of claim 1, wherein said radiating fins are respectively made of a copper sheet by stamping.

5. The CPU heat sink of claim 1, wherein said metal base is molded from aluminum by die-casting.

6. A CPU heat sink comprising:
   a plurality of metal radiating fins arranged in parallel, said radiating fins each comprising a transverse foot bar, and a plurality of strips respectively upwardly extended from said transverse foot bar and arranged in parallel; and
   a metal base molded on the transverse foot bar of each of said metal radiating fins, said metal base having a flat bottom surface for direct contact with a CPU.

7. The heat sink of claim 6, wherein said metal base comprises four upright pots disposed in four corners, said upright posts each comprising a screw hole for the mounting of a fan.

8. The heat sink of claim 7, further comprising a plurality of bearing blocks respectively fastened to said upright posts by screws and adapted to support a fan on said upright posts above said radiating fins.

* * * * *